US012801450B2

(12) United States Patent
Nomura et al.

(10) Patent No.: US 12,801,450 B2
(45) Date of Patent: Nov. 17, 2026

(54) SYSTEMS AND METHODS FOR REDUCING POWER CONSUMPTION WITH A COMPUTATION PROCESSING DEVICE

(71) Applicant: TOHOKU UNIVERSITY, Miyagi (JP)

(72) Inventors: Osamu Nomura, Miyagi (JP); Tetsuo Endoh, Miyagi (JP); Yitao Ma, Miyagi (JP); Ko Yoshikawa, Miyagi (JP)

(73) Assignee: Tohoku University, Miyagi (JP)

( * ) Notice: Subject to any disclaimer, the term of this patent is extended or adjusted under 35 U.S.C. 154(b) by 560 days.

(21) Appl. No.: 18/286,638

(22) PCT Filed: Jun. 15, 2022

(86) PCT No.: PCT/JP2022/023990
§ 371 (c)(1),
(2) Date: Oct. 12, 2023

(87) PCT Pub. No.: WO2022/265044
PCT Pub. Date: Dec. 22, 2022

(65) Prior Publication Data
US 2024/0126616 A1 Apr. 18, 2024

(30) Foreign Application Priority Data
Jun. 18, 2021 (JP) ................................ 2021-101996

(51) Int. Cl.
*G06F 9/50* (2006.01)
*G11C 5/14* (2006.01)

(52) U.S. Cl.
CPC .............. *G06F 9/5061* (2013.01); *G11C 5/14* (2013.01); *G06F 2209/5011* (2013.01)

(58) Field of Classification Search
None
See application file for complete search history.

(56) References Cited

U.S. PATENT DOCUMENTS 7,019,418 B2 * 3/2006 Kakiuchi ............... H10D 84/85 327/427
8,095,809 B2 * 1/2012 Priel ......................... G06F 1/32 713/323
(Continued)

FOREIGN PATENT DOCUMENTS

JP 2015210709 A 11/2015
JP 2018018569 A 2/2018
(Continued)

OTHER PUBLICATIONS

International Search Report dated Aug. 23, 2022 in PCT/JP2022/023990.

*Primary Examiner* — Van H Nguyen
(74) *Attorney, Agent, or Firm* — Fox Rothschild LLP; Carol E. Thorstad-Forsyth

(57) ABSTRACT

Systems and methods for further reducing power consumption comprising a computation processing device. The device includes: a convolutional computation unit that sequentially outputs convolutional computation result data; a pooling processing unit including a pooling computation circuit and a non-volatile storage circuit for pooling, in which the non-volatile storage circuit for pooling retains the convolutional computation result data or a computation result of the pooling computation circuit, as retained data, and the pooling computation circuit calculates and outputs pooling data subjected to pooling processing to a pooling region by using the retained data each time when the convolutional computation result data is input from the convolutional computation unit; and a power gating unit that blocks power supply to the non-volatile storage circuit for pooling while waiting for the input of the convolutional computation result data from the convolutional computation unit.

13 Claims, 10 Drawing Sheets

(56) References Cited

U.S. PATENT DOCUMENTS

| | | | | |
|---|---|---|---|---|
| 9,235,255 | B2 * | 1/2016 | Sasaki | G06F 1/3237 |
| 10,545,556 | B2 * | 1/2020 | Venkatasubramanian | G06F 1/3206 |
| 10,930,323 | B2 * | 2/2021 | Ishizu | H10D 86/60 |
| 11,074,498 | B2 * | 7/2021 | Seo | G06F 1/3237 |
| 11,195,079 | B2 * | 12/2021 | Sumbul | G06N 3/0464 |
| 11,460,338 | B2 * | 10/2022 | Yaoi | G01G 13/16 |
| 11,816,563 | B2 * | 11/2023 | Rakshit | G06F 17/16 |
| 2013/0332758 | A1 * | 12/2013 | Sasaki | G06F 1/324<br>713/322 |

FOREIGN PATENT DOCUMENTS

| | | | |
|---|---|---|---|
| NO | 2018189620 | A1 | 10/2018 |
| WO | 2019189895 | A1 | 10/2019 |
| WO | 2020161845 | A1 | 8/2020 |

* cited by examiner

SYSTEMS AND METHODS FOR REDUCING POWER CONSUMPTION WITH A COMPUTATION PROCESSING DEVICE

CROSS-REFERENCE TO RELATED APPLICATIONS

This application is a § 371 national phase entry of International Patent Application No. PCT/JP2022/023990, filed on Jun. 15, 2022, which claims priority to and the benefit of Japanese Patent Application No. JP2021-101996 filed on Jun. 18, 2021, both of which are hereby incorporated herein by reference in their entireties.

TECHNICAL FIELD

The present invention relates to a computation processing device.

BACKGROUND ART

A computation processing device recognizing an image by using a convolutional neural network, that is, a neural network including a convolutional layer is known, and is expected to be applied to robot control, vehicle driving control, or the like. In the convolutional neural network such as image recognition, convolutional computation processing and pooling processing are performed. In the convolutional computation processing, massive sum-of-product computation of weighting and adding data of an input layer or an intermediate layer by using weight data of a convolutional filter is performed. In the pooling processing, for example, the maximum value is extracted or the average value is calculated from a plurality of convolutional computation results obtained in the convolutional computation processing.

In PTL 1, a computation processing device performing computation processing of a convolutional neural network is proposed in which a part of all convolutional computation results required in one pooling processing piece is obtained for each one computation cycle, and thus, a circuit scale for performing convolutional computation decreases.

On the other hand, as a technology of suppressing power consumption, power gating of blocking power supply to a computation circuit such as a processor core and suppressing a current leakage is known.

CITATION LIST

Patent Literature

PTL 1: JP-A-2015-210709

SUMMARY OF INVENTION

Technical Problem

In the computation processing device of the convolutional neural network, as described above, the sum-of-product computation of a massive number of computation, or the like is required, and thus, there is a problem of power consumption. In particular, it is important to suppress the power consumption in an end device such as a robot, a vehicle, or a mobile terminal as much as possible. Accordingly, in the computation processing device performing computation, such as a convolutional neural network, it is desirable to further reduce the power consumption.

The invention has been made in consideration of the circumstances described above, and an object thereof is to provide a computation processing device capable of further reducing power consumption.

Solution to Problem

In order to attain the object described above, a computation processing device of the invention, includes: a convolutional computation unit that sequentially outputs convolutional computation result data; a pooling processing unit including a pooling computation circuit and a non-volatile storage circuit for pooling, in which the non-volatile storage circuit for pooling retains the convolutional computation result data or a computation result of the pooling computation circuit, as retained data, and the pooling computation circuit calculates and outputs pooling data subjected to pooling processing to a pooling region by using the retained data each time when the convolutional computation result data is input from the convolutional computation unit; and a power gating unit that blocks power supply to the non-volatile storage circuit for pooling while waiting for the input of the convolutional computation result data from the convolutional computation unit.

A computation processing device of the invention, includes: a convolutional computation unit that sequentially outputs convolutional computation result data in a row direction of a channel in which a plurality of convolutional computation result data pieces are two-dimensionally arrayed for each row of the channel; and a pooling processing unit including a pooling computation circuit and a non-volatile storage circuit for pooling, that outputs the convolutional computation result data to be a maximum value in each pooling region obtained by dividing the plurality of convolutional computation result data pieces for each 2 rows and 2 columns of the channel, as pooling data, in which the non-volatile storage circuit for pooling includes buffers connected to Y+2 stages in which the number of columns of the channel is Y (Y is an even number of 2 or more), and each time when the convolutional computation result data from the convolutional computation unit is input to a buffer of a first stage, the buffer of the first stage retains and outputs the input convolutional computation result data, and each of buffers of second and subsequent stages retains and outputs the convolutional computation result data output from a buffer of a previous stage, the pooling computation circuit includes a comparator, to which a data group including each of the convolutional computation result data pieces from each buffer of a first stage, a second stage, a Y+1-th stage, and a Y+2-th stage is input, that compares each of the convolutional computation result data pieces of the data group, and a selector that selects and outputs the convolutional computation result data to be a maximum value among the data group, on the basis of a comparison result of the comparator, and the pooling processing unit outputs the convolutional computation result data output from the selector when each of the convolutional computation result data pieces of the data group is a combination of the convolutional computation result data in one of the pooling regions, as the pooling data.

Advantageous Effects of Invention

According to the invention, when the pooling processing unit waits for the input of the convolutional computation result data from the convolutional computation unit, power supply to the non-volatile storage circuit for pooling is blocked by the power gating unit, and thus, it is possible to further reduce the power consumption of the computation processing device.

According to the invention, it is possible to set the number of buffers retaining the convolutional computation result data to be less (number of columns+2) than the number of element data (number of columns×number of rows) of the channel, and to further reduce the power consumption.

DESCRIPTION OF EMBODIMENTS

Figure 1:
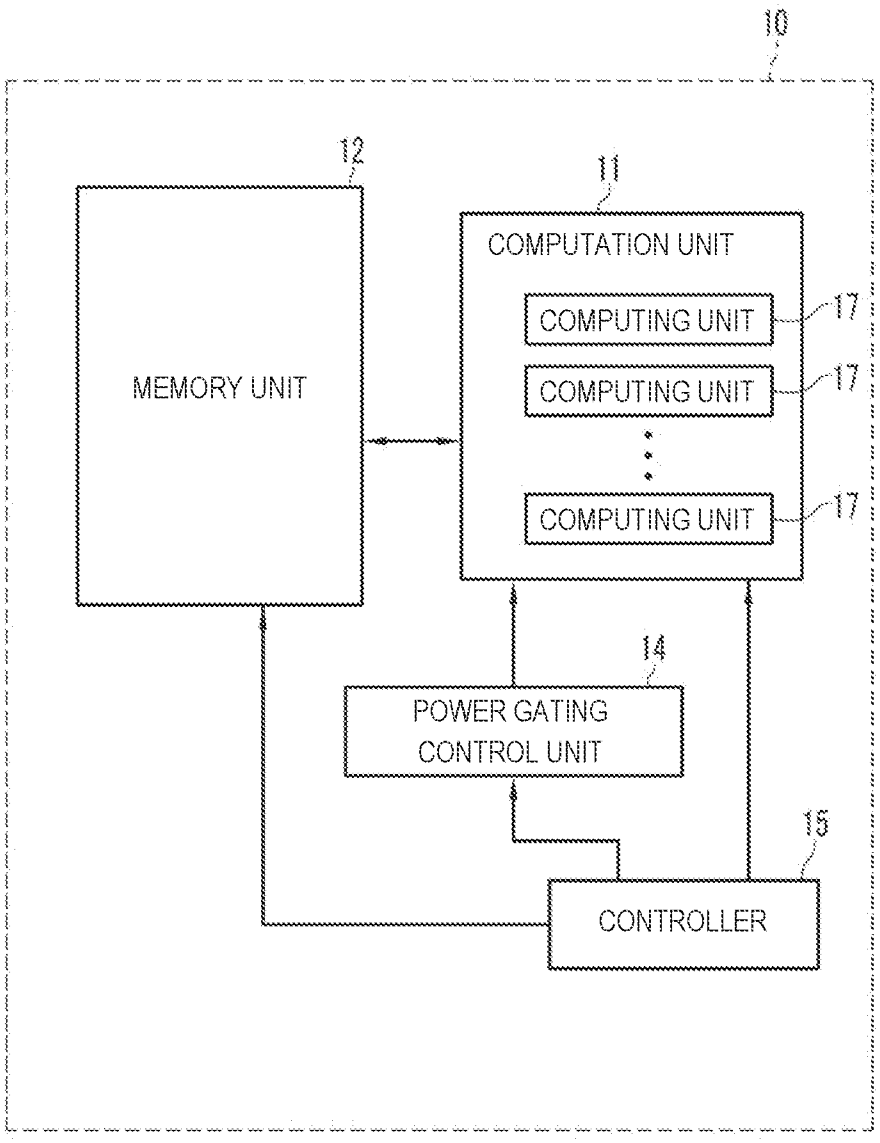
FIG. 1 is a block diagram illustrating an outline of a computation processing device.

In FIG. 1, a computation processing device 10 performs computation processing based on a convolutional neural network. The computation processing device 10 includes a computation unit 11 performing convolutional computation processing using a convolutional filter, and pooling processing with respect to a channel (also referred to as a feature map), a memory unit 12, a power gating control unit 14, and a controller 15 comprehensively controlling the above units. As described below in detail, in the computation unit 11, k (k is an integer of 2 or more) computing units 17 performing the convolutional computation processing and the pooling processing are provided in parallel.

A plurality of layers are connected to the convolutional neural network on which the computation processing device 10 is based. Each of the layers includes one or a plurality of channels. The first layer is an input layer, and for example, is an image including each channel of RGB, and the like. First to fourth layers are connected to the convolutional neural network illustrated in FIG. 2 as an example. The first layer includes three channels ch1-1 to ch1-3, the second layer includes four channels ch2-1 to ch2-4, the third layer includes three channels ch3-1 to ch3-3, and the fourth layer includes three channels ch4-1 to ch4-3.

Among the first to fourth layers, the first layer and the second layer are a layer to be a target of the convolutional computation processing, and each generates the channels ch1-1 to ch1-3 of the first layer to the channels ch2-1 to ch2-4 of the second layer, and the channels ch2-1 to ch2-4 of the second layer to the channels ch3-1 to ch3-3 of the third layer by the convolutional computation processing. The third layer is a layer to be a target of the pooling processing, and generates the channels ch3-1 to ch3-3 of the third layer to the channels ch4-1 to ch4-3 of the fourth layer by the pooling processing.

There can be one or a plurality of channels of each of the layers. In the convolutional computation processing, in the previous and next layers, the number of channels may increase or decrease, or the number of channels may not be changed. In the pooling processing, in the previous and next layers, the number of channels is the same. The layer may be three layers or five or more layers.

The computation unit 11 performs the convolutional computation processing or the pooling processing with respect to a channel of a n-th layer, in which n is an integer of 1 or more, to generate a n+1-th layer. The generation of the layer is the generation of each of the channels configuring the layer, and the generation of the channel is the calculation of each element data piece configuring the channel. In the following description, the n-th layer will be described as the previous layer with respect to the n+1-th layer, and the n+1-th layer will be described as the next layer with respect to the n-th layer. Therefore, the channel of the next layer is generated by the convolutional computation processing and the pooling processing with respect to the channel of the previous layer.

The channel includes a plurality of element data pieces that are two-dimensionally arrayed. The two-dimensional array of the element data is an array on a data structure, and indicates that position information is applied such that the position of each of the element data pieces is specified in two variables (in this description, the row and the column), and a position relationship between the element data pieces is specified. The same applies to weight data described below. The size of each of the channels, that is, the number of element data in a row direction and a column direction is any number, and is not particularly limited. In this example, the two-dimensional channels will be described, but the channels may be one-dimensional or three or more-dimensional channels.

In the convolutional computation processing, the element data is calculated by convolutional computation. The element data calculated by the convolutional computation is a value obtained by adding the result of applying the convolutional filter to each of the element data pieces in convolutional regions for each of the channels of the previous layer, in each of the convolutional regions at the same position of each of the channels. The application of the convolutional filter is the obtaining of a sum-of-product computation result of the element data in the convolutional region and the weight data of the convolutional filter.

In the convolutional filter, the weight data to be a weight with respect to the element data is two-dimensionally arrayed. In this example, one convolutional filter includes 3×3 (3 rows and 3 columns) weight data pieces. Each of the weight data pieces of the convolutional filter is set to a value according to the purpose of the convolutional filter, or the like. In this example, a convolutional filter corresponding to a combination between the channel of the previous layer and the channel of the next layer is used.

The convolutional region defines a range to which the convolutional filter is applied on the channel, and has the same array size (in this example, 3 rows and 3 columns) as that of the convolutional filter. In the convolutional computation, the weight data of the convolutional filter and the element data of the convolutional region are multiplied at the corresponding positions. In the convolutional computation processing, the convolutional region is moved to scan the entire channel while moving the position of the region by one element data piece, and element data calculation processing is performed each time when the convolutional region is moved.

In this example, the convolutional computation is performed for each of the channels of the next layer by using all of the channels of the previous layer. The convolutional computation is performed by using the convolutional filter corresponding to the combination between the channel of the previous layer and the channel of the next layer.

Figure 2:
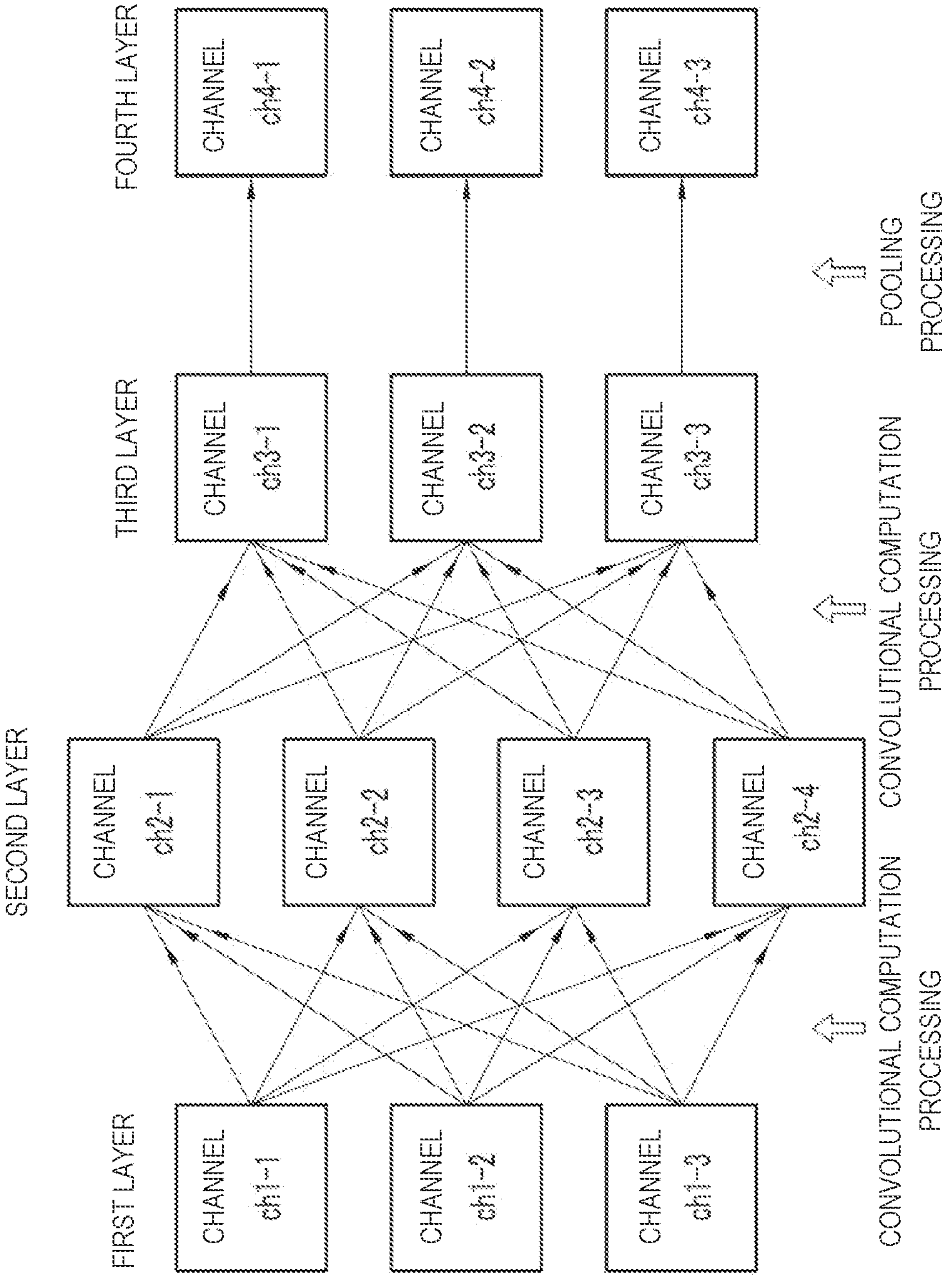
FIG. 2 is an explanatory diagram illustrating an example of connected layers of a convolutional neural network.

Therefore, in the example illustrated in FIG. 2, for example, when the channel ch3-1 of the third layer is generated, a convolutional filter associated with a combination between the channel ch2-1 and the channel ch3-1 is used at the time of applying the convolutional filter to the channel ch2-1, and a convolutional filter associated with a combination between the channel ch2-2 and the channel ch3-1 is used at the time of applying the convolutional filter to the channel ch2-2. As described above, when the channel ch3-1 is generated, the convolutional computation is performed by using four convolutional filters corresponding to four combinations between the channel ch3-1 and the channels ch2-1 to ch2-4. Similarly, when the channel ch3-2 is generated, the convolutional computation is performed by using four convolutional filters corresponding to four combinations between the channel ch3-2 and the channels ch2-1 to ch2-4, and when the channel ch3-3 is generated, the convolutional computation is performed by using four convolutional filters corresponding to four combinations between the channel ch3-3 and the channels ch2-1 to ch2-4.

In the convolutional computation processing, in order to generate one channel of the next layer, any number of channels of the previous layer can also be used, and in order to generate one channel of the next layer, one channel of the previous layer can also be used. All or a part of a plurality of convolutional filters used in one layer may have a common weight array. In a case where the convolutional filters have the common weight array, one convolutional filter with the common weight array may be prepared, and one convolutional filter may be used when calculating the plurality of channels.

In the pooling processing, as an example, each of the channels of the next layer, of which the size in the row direction and the column direction is reduced, is generated from each of the channels of the previous layer. In this example, as the pooling processing, maximum value pooling processing of extracting the maximum value from pooling regions of 2 rows and 2 columns is performed. Accordingly, each of the channels is divided into a plurality of pooling regions of 2 rows and 2 columns such that the regions do not overlap with each other, and for each of the pooling regions, the element data with the maximum value in the region is output as the result of the pooling processing. The size of the pooling region is not limited to 2 rows and 2 columns. In a case where one of p and q is an integer of 1 or more, and the other is an integer of 2 or more, the pooling region may be p rows and q columns. Instead of the maximum value pooling processing, as described below, average value pooling processing of outputting the average value of the element data of the pooling region may be performed. It is also possible to perform the convolutional computation processing with respect to the layer including the channels reduced by the pooling processing. The pooling regions can also be divided such that the regions partially overlap with each other, and in this case, the pooling processing can also be performed to generate the channel of the next layer with the same size in the row direction and the column direction as that of the channel of the previous layer.

Figure 3:
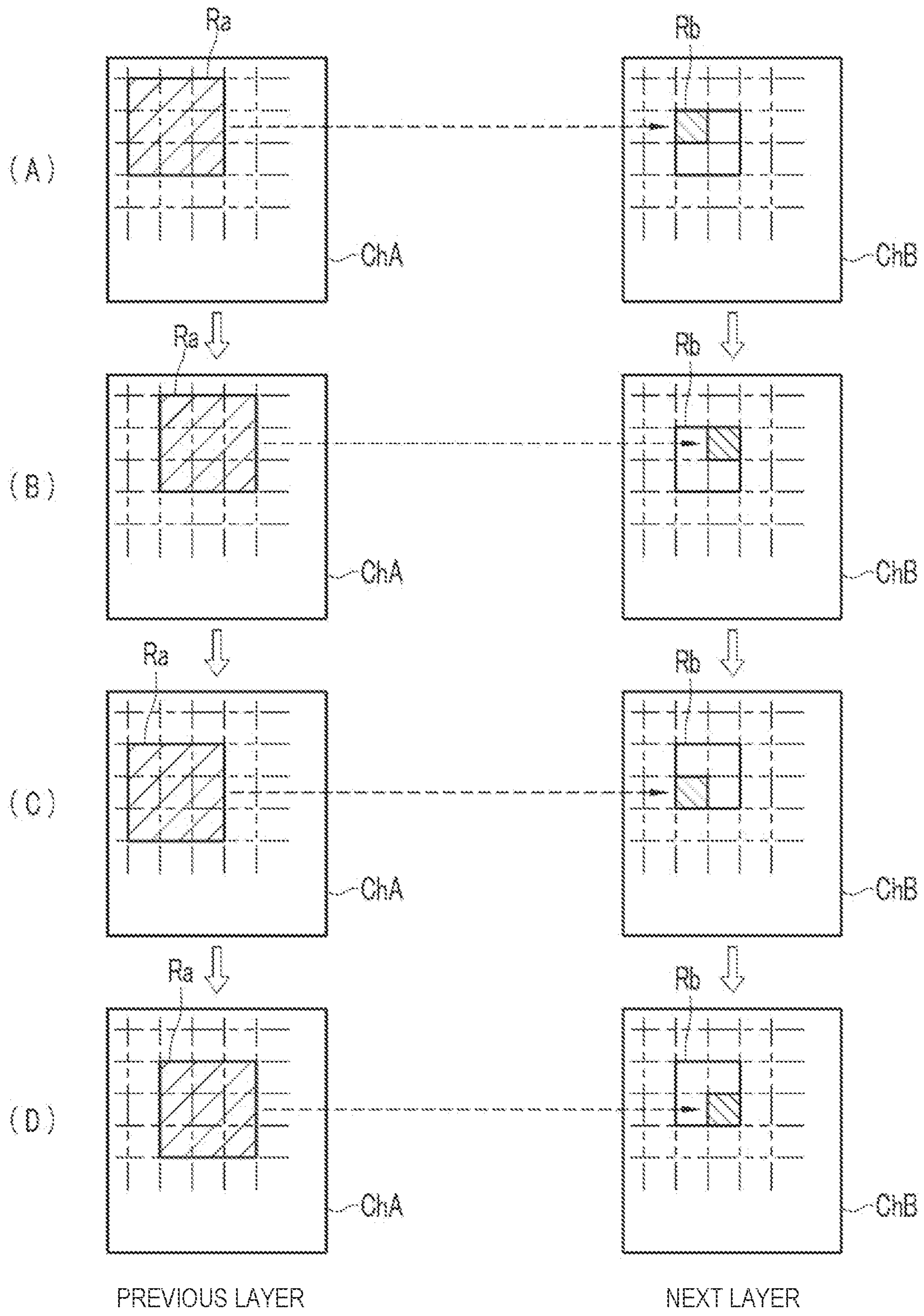
FIG. 3 is an explanatory diagram illustrating a relationship between a movement of a position of a convolutional region and a pooling region.

As illustrated in FIG. 3(A), a convolutional region Ra of this example is 3 rows and 3 columns. In the computation unit 11, when obtaining the element data of a channel ChB of a layer to be a target of the pooling processing (the next layer, in the example of FIG. 2, the third layer), the convolutional region Ra in a channel ChA of the previous layer is sequentially moved to a position illustrated in FIG. 3(A), a position moved in the row direction by one element data piece from the position illustrated in FIG. 3(A), as illustrated in FIG. 3(B), a position moved in the column direction by one element data piece from the position illustrated in FIG. 3(A), as illustrated in FIG. 3(C), and a position moved in the row direction by one element data piece from the position illustrated in FIG. 3(C), as illustrated in FIG. 3(D). Accordingly, the element data in one pooling region Rb in the channel ChB of the next layer is continuously calculated. In a case where the element data in one pooling region Rb is continuously calculated, the movement order of the convolutional region Ra is not limited to the order described above.

In FIG. 1, the memory unit 12 stores the weight data of the convolutional filter, and the element data of each of the channels of the layer to which the convolutional computation processing is applied, that is, the previous layer, in which convolutional computation result data and pooling data, that is, the element data of each of the channels of the next layer is written. For the layer to be the target of the pooling processing, the element data obtained by the convolutional computation is handed over to the pooling processing in the computing unit 17, and thus, is not written in the memory unit 12.

As described below in detail, the power gating control unit 14 controls power supply in each of the computing units 17, that is, controls power gating, under the control of the controller 15.

Figure 4:
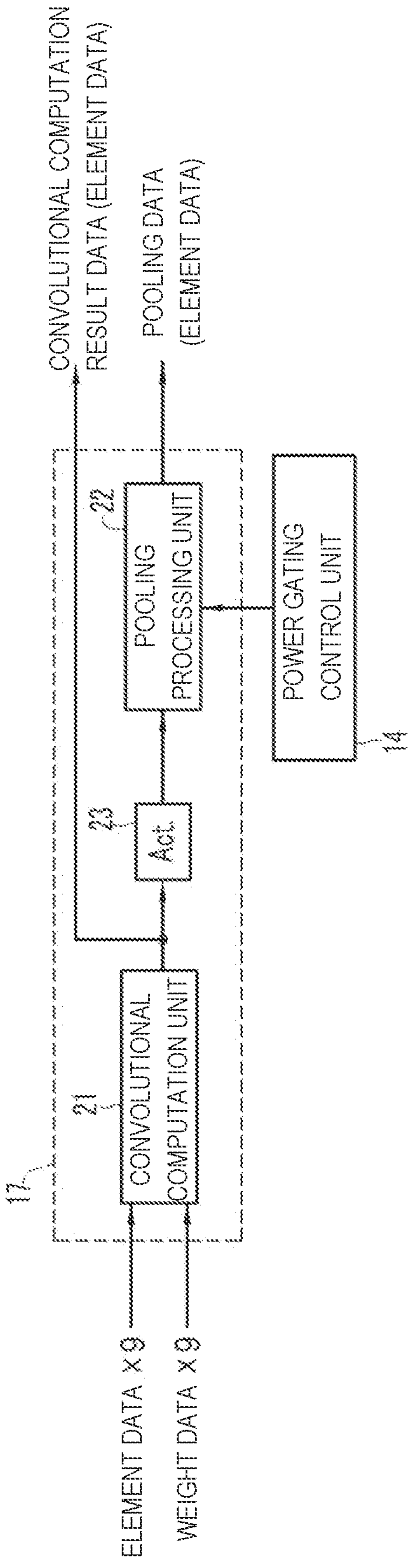
FIG. 4 is a block diagram illustrating a configuration of a computing unit.

As illustrated in FIG. 4, the computing unit 17 includes a convolutional computation unit 21 performing the convolutional computation, a pooling processing unit 22 performing pooling (in this example, the extraction of the maximum value), and an activation function processing unit 23. In addition, in the computing unit 17, a bit number adjustment circuit (not illustrated) converting a data length of the element data output from the convolutional computation unit 21 into a predetermined data length, and the like are provided.

The convolutional computation unit 21 obtains the element data by performing the convolutional computation. The convolutional computation unit 21 calculates one element data piece by one convolutional computation piece. When one element data is calculated, for each of the channels of the previous layer, nine element data pieces in the convolutional region and nine weight data pieces of the convolutional filter are input to the convolutional computation unit 21 while sequentially switching the channel of the previous layer.

The element data from the convolutional computation unit 21 is input to the activation function processing unit 23, and is converted by using an activation function. Examples of the activation function include a step function, a sigmoid function, a rectified linear unit (ReLU), a leaky rectified linear unit (leaky ReLU), a hyperbolic tangent function, and the like. The element data that has passed through the activation function processing unit 23 is sent to the memory unit 12 and the pooling processing unit 22 as the element data of the next layer.

The pooling processing unit 22 performs the pooling processing described above, and outputs the element data to be the maximum value in the pooling region. Power supply to the pooling processing unit 22 is controlled by the power gating control unit 14.

In the following description, the element data (including the element data that has passed through the activation function processing unit 23) obtained by the convolutional computation of the convolutional computation unit 21 may be particularly referred to as the convolutional computation result data, and the element data obtained by the pooling processing of the pooling processing unit 22 may be particularly referred to as the pooling data.

Figure 5:
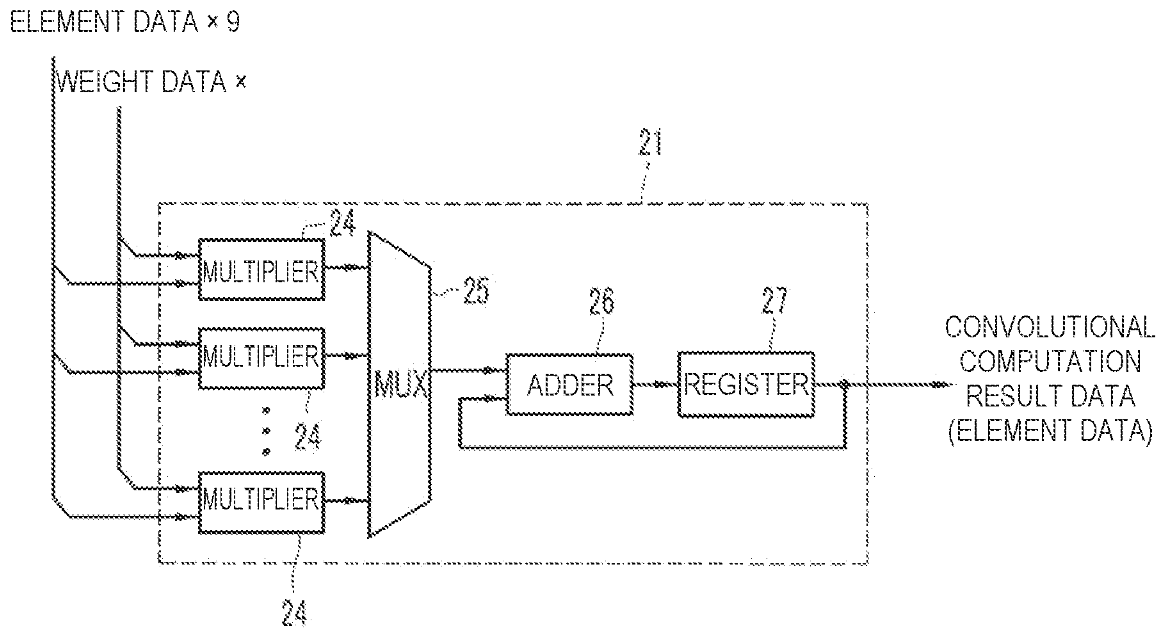
FIG. 5 is a block diagram illustrating a configuration of a convolutional computation circuit.

FIG. 5 illustrates an example of the convolutional computation unit 21. The convolutional computation unit 21 includes multipliers 24 with the same number as that of the weight data of the convolutional filter (in this example, 9), a multiplexer 25, an adder 26, a register 27, and the like. The element data and the weight data are input to each of the multipliers 24, and a multiplication result obtained by multiplying the element data and the weight data is output. The multiplexer 25 selects and outputs the multiplication results from each of the multipliers 24 one by one. The register 27 retains an addition result of the adder 26. Each time when one multiplication result is output from the multiplexer 25, the adder 26 adds the multiplication result from the multiplexer 25 and the data retained in the register 27, and retains the addition result in the register 27. The element data of each of the channels of the previous layer and the weight data of the convolutional filter are input to the convolutional computation unit 21, and finally, the addition result retained in the register 27 is output as the convolutional computation result data (the element data). The configuration of the convolutional computation unit 21 is not limited thereto.

Figure 6:
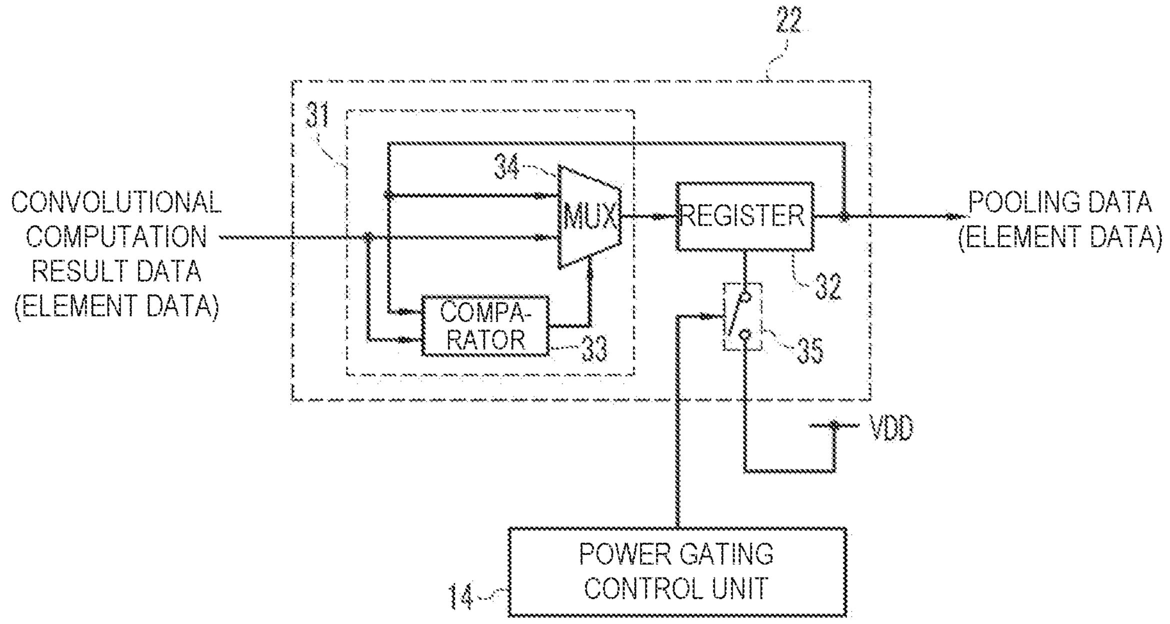
FIG. 6 is a block diagram illustrating a configuration of a pooling processing unit.

In FIG. 6, the pooling processing unit 22 includes a pooling computation circuit 31, and a register 32 as a non-volatile storage circuit for pooling. The pooling computation circuit 31 performs extraction processing of extracting the element data to be the maximum value in the pooling region, in cooperation with the register 32. The pooling computation circuit 31 includes a comparator 33 and a multiplexer 34. The register 32, for example, includes a plurality of non-volatile flip-flops (NV-FF) using a magnetic tunnel junction (MTJ) element, or the like. The non-volatile flip-flop using the magnetic tunnel junction element has a small size on a substrate, compared to other non-volatile flip-flops, is advantageous in the convolutional neural network in which high-density integration is required, and is advantageous to reduce the power consumption since an operation voltage is low.

The register 32 is non-volatile, and thus, retains data even in a case where the power supply is blocked, and in a case where the power is supplied, the register is capable of reading out the data retained when the power source is blocked and outputting the data. The register 32 retains the element data selected by the multiplexer 34, as retained data. The register 32 is reset each time when the output of the maximum value of the pooling region is completed, and the retained contents are set to the initial value (a value "0"). The configuration of the storage circuit for pooling is not limited to the configuration described above.

The element data from the convolutional computation unit 21 and the element data retained in the register 32 are input to the comparator 33 and the multiplexer 34 configuring the pooling computation circuit 31 through the activation function processing unit 23. The comparator 33 compares two element data pieces to be input, and outputs a selection signal for selecting the element data with a larger value to the multiplexer 34. The multiplexer 34 functions as a selector, and selects and outputs one of the element data pieces input on the basis of the selection signal. Accordingly, the element data with a larger value among the element data from the convolutional computation unit 21 and the element data retained in the register 32 is output from the multiplexer 34, and the output element data is retained in the register 32, as new retained data.

By sequentially inputting each of the element data pieces of the pooling region calculated by the convolutional computation unit 21 to the pooling computation circuit 31, the element data to be the maximum value in the pooling region is retained in the register 32, and the retained element data is output as pooling data for one pooling region.

A driving voltage (VDD) is applied to the register 32 through a PG switch 35. The PG switch 35 configures a power gating unit together with the power gating control unit 14. The PG switch 35 includes a MOS transistor or the like, and the on and off of the PG switch is controlled by the power gating control unit 14. In a case where the PG switch 35 is turned on, the register 32 receives the power supply, and thus, data can be written in and output (read out). In a case where the PG switch 35 is turned off, a driving voltage is applied to the register 32, that is, the power supply is blocked, and thus, the data is not capable of being written in and output. Accordingly, it is possible to perform the power gating with respect to the register 32. In this example, the PG switch 35 is provided for each pooling processing unit 22, but one PG switch 35 common to each of the pooling processing units 22 may be provided.

In a pooling processing period, the power gating control unit 14 turns on the PG switch 35 at least while writing and outputting the element data with respect to the register 32, and turns off the PG switch 35 in the other periods to reduce the power consumption. In this example, in the pooling processing period, while the pooling processing unit 22 waits for the input of the element data from the convolutional computation unit 21, that is, while the pooling processing unit 22 does not perform the processing, the PG switch 35 is turned off, and in the other periods, the PG switch 35 is turned on. Specifically, a period in which the PG switch 35 is turned on is a period from a timing when the output of the element data from the convolutional computation unit 21, that is, the input of the element data to the pooling processing unit 22 until new element data is retained in the register 32 by the processing of the pooling computation circuit 31, or in a case where the pooling data is output, until the output is completed. The PG switch 35 is turned off except for the pooling processing period.

In this example, as described above, each of the element data pieces of the pooling region sequentially calculated by the convolutional computation unit 21 is input to the pooling processing unit 22 each time when the element data is calculated. Accordingly, the start of the pooling processing period is a time point when the convolutional computation processing for generating the channel of the layer to be a target of the pooling processing is started or a time point when the first element data in the layer to be a target of the pooling processing is input to the pooling processing unit 22. The end of the pooling processing period is a time point when the output of the final element data of the channel generated by the pooling processing from the pooling processing unit 22 is completed.

In the case of focusing on one pooling region, a time point when the convolutional computation for calculating the element data of the pooling region is started or a time point when the first element data of the pooling region is input to the pooling processing unit 22 is the start of the pooling processing period, and a time point when the output of the element data to be the maximum value of the pooling region retained in the register 32 is completed is the end of the pooling processing period. The completion of the output of the element data retained in the register 32 is a time point when the element data output from the register 27 is acquired by a circuit to be acquired from the register 27. In this example, a time point when the memory unit 12 latches the element data is the completion of the output of the element data.

The computation processing device 10 performs the convolutional computation processing by using K computing units 17 provided in the computation unit 11, in a mode referred to as channel parallel of calculating one element data piece in parallel for each of k channels of the next layer. In a case where the layer generated by the convolutional computation processing is the target of the pooling processing, the computation processing device 10 moves the convolutional region in the k channels to continuously calculate the plurality of element data pieces in the pooling region, as described above, each time when calculating one element data piece for each of the k channels of the next layer. In a case where the next layer generated by the convolutional computation processing is not the target of the pooling processing, the element data may be calculated in modes other than the mode described above.

Figure 7:
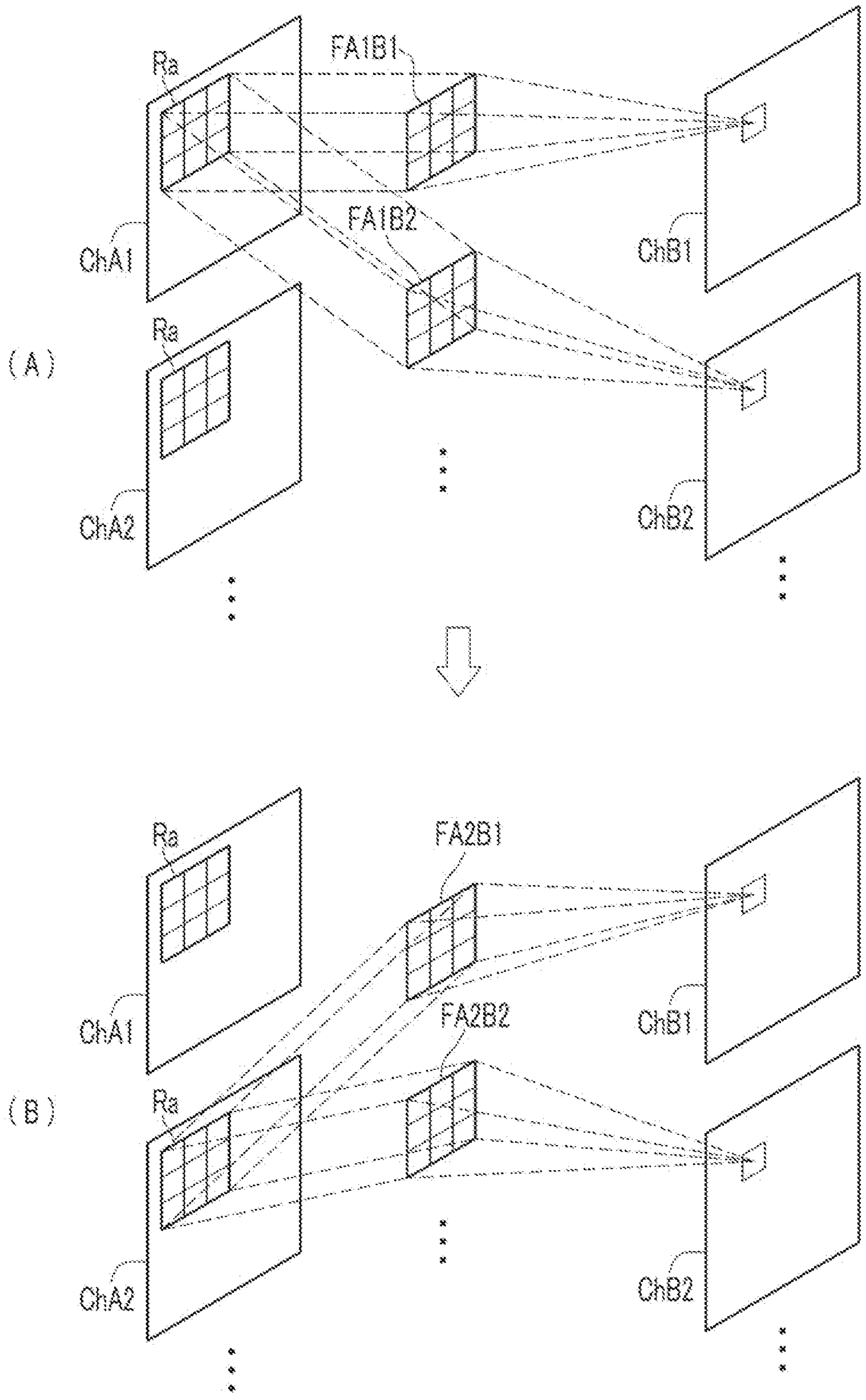
FIG. 7 is an explanatory diagram illustrating a state of convolutional computation processing when performing computation with respect to first element data of a next layer by channel parallel.
Figure 8:
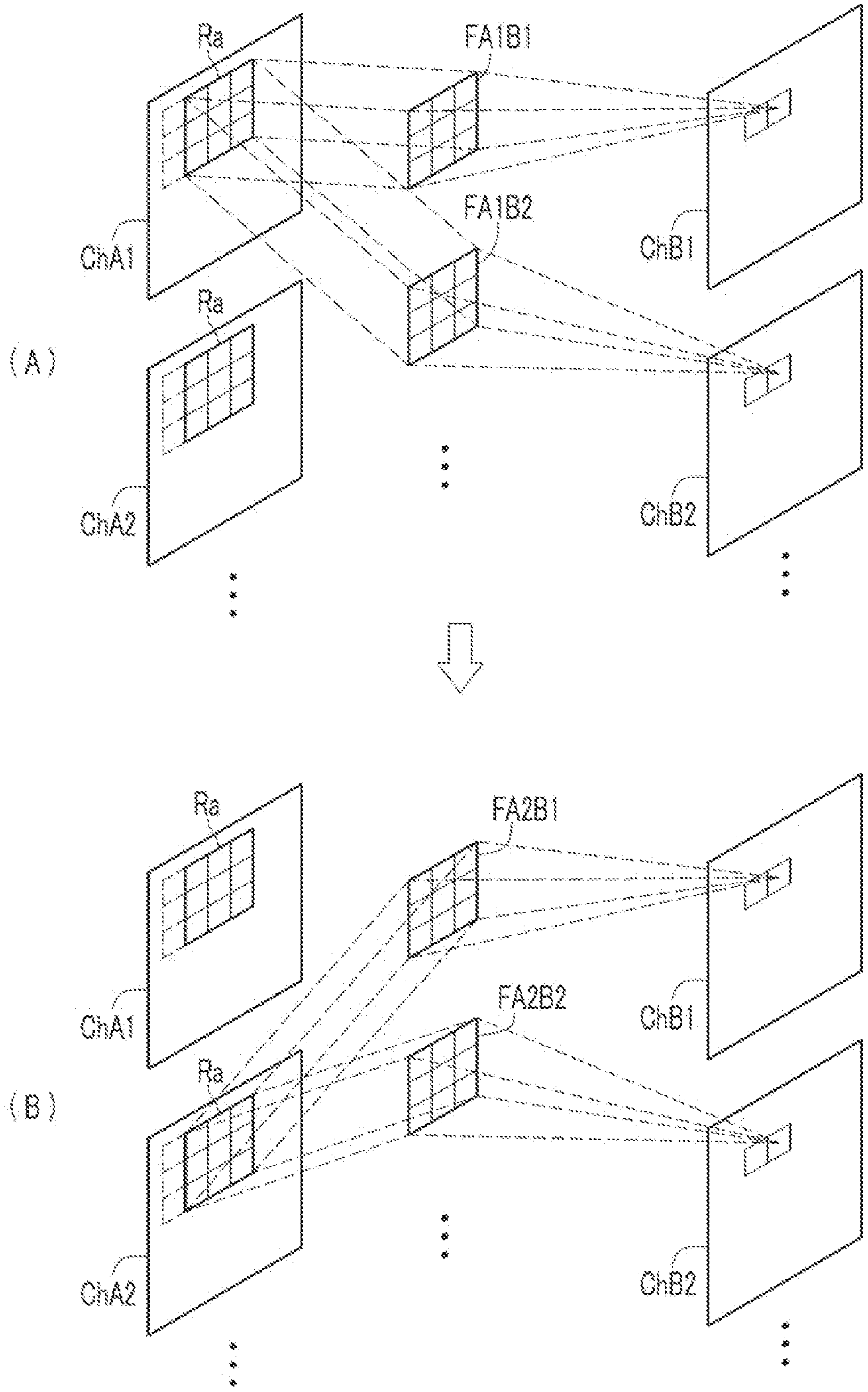
FIG. 8 is an explanatory diagram illustrating a state of the convolutional computation processing when performing the computation with respect to second element data of the next layer by the channel parallel.

Next, as the function of the configuration described above, a case will be described in which the convolutional computation processing is performed with respect to the n-th layer to generate the n+1-th layer, and the pooling processing is performed with respect to the n+1-th layer to generate the n+2-th layer. In the convolutional computation processing, as illustrated in FIG. 7 and FIG. 8, the n-th layer includes channels ChA1, ChA2, and the n+1-th layer including channels ChB1, ChB2, . . . is generated from the n-th layer.

First, computation of applying the convolutional filter to the convolutional region Ra of the first channel ChA1 of the n-th layer is performed by each of the computing units 17 of the computation unit 11. Nine element data pieces of the convolutional region Ra of the channel ChA1 are read out from the memory unit 12, and are input to the convolutional computation unit 21 of each of the computing units 17. Nine weight data pieces of one convolutional filter are input to one convolutional computation unit 21, and thus, the weight data of convolutional filters FA1B1, FA1B2, . . . corresponding to the first channel ChA1 and the first to k-th channels ChB1, ChB2, . . . of the next layer is read out from the memory unit 12, and is input to the convolutional computation unit 21 of each of the computing units 17. Accordingly, each of the convolutional computation units 21 multiplies the input element data of the convolutional region Ra of the channel ChA1 and the weight data of the convolutional filter with the corresponding data pieces, and stores a sum-of-product result that is the sum of such multiplication results in the register 27 (FIG. 7(A)).

Next, computation of applying the convolutional filter to the convolutional region Ra at the same position as that of the first channel ChA1, in the second channel ChA2 of the n-th layer, is performed by each of the computing units 17. Nine element data pieces of the convolutional region Ra in the channel ChA2 are input to the convolutional computation unit 21 of each of the computing units 17, and the weight data of convolutional filters FA2B1, FA2B2, . . . corresponding to the second channel ChA2 and the first to k-th channels ChB1, ChB2, . . . of the next layer is input to each of the computing units 17.

Each of the computing units 17, for example, corresponds to one channel of the next layer until the calculation of all the element data of k channels is completed, and the corresponding channel of the next layer is not changed. Accordingly, for example, in the computation using the first channel ChA1 of the previous layer as a target, the weight data of the convolutional filter FA1B1 corresponding to the second channel ChB1 is input to the computing unit 17, and in the computation of the second channel ChA2, the weight data of the convolutional filter FA2B2 corresponding to the second channel ChB2 is also input to the computation unit.

As described above, the element data and the weight data are input to each of the computing units 17, and thus, a value obtained by adding a sum-of-product result obtained by applying the convolutional filter to the convolutional region Ra of the channel ChA2 to a sum-of-product result obtained by applying the convolutional filter to the convolutional region Ra of the channel ChA1 is stored in the register 27 of each of the convolutional computation units 21 (FIG. 7(B)).

Hereinafter, similarly, computation of applying the convolutional filter to the convolutional region Ra at the same position as that of the first channel ChA1 is sequentially performed by the convolutional computation unit 21 of each of the computing units 17 for each of the third and subsequent channels of the n-th layer. In a case where the computation of applying the convolutional filter to the convolutional region Ra of the final channel of the n-th layer is completed, the total sum of the sum-of-product results obtained by applying the convolutional filter to the convolutional region Ra of each of the channels of the previous layer, that is, the first element data of each of the first to k-th channel of the next layer are each stored in the register 27 of each of the convolutional computation units 21. Each of the first element data pieces (the convolutional computation result data) obtained as described above is output from the convolutional computation unit 21.

As described above, the convolutional computation unit 21 of each of the computing units 17 calculates the first element data, and then, as illustrated in FIG. 8(A), performs computation of applying the convolutional filters FA1B1, FA1B2, . . . to the convolutional region Ra of the first channel ChA1 of the previous layer in the same procedure as described above, by shifting the convolutional region Ra in the row direction by one element data piece. After that, similarly, in the same procedure, as illustrated in FIG. 8(B), computation of applying convolutional filters FA2B1, FA2B2, . . . to the convolutional region Ra in the second channel ChA2 of the previous layer is performed by the convolutional computation unit 21. Hereinafter, similarly, the computation of applying the convolutional filter to the convolutional region Ra is sequentially performed with respect to each of the third and subsequent channels of the previous layer, and the second element data is calculated for each of the first to k-th channels, and is output from the convolutional computation unit 21.

After the second element data is calculated, the third element data is calculated and output by the convolutional computation unit 21 in the same procedure as described above, by shifting the convolutional region Ra in the column direction from the initial position by one element data piece. After the third element data is calculated, the fourth element data is calculated and output by the convolutional computation unit 21 in the same procedure as described above, by shifting the convolutional region Ra in the row direction by one element data piece. As described above, four element data pieces of the pooling region to be a target of the pooling processing are continuously calculated.

Figure 9:
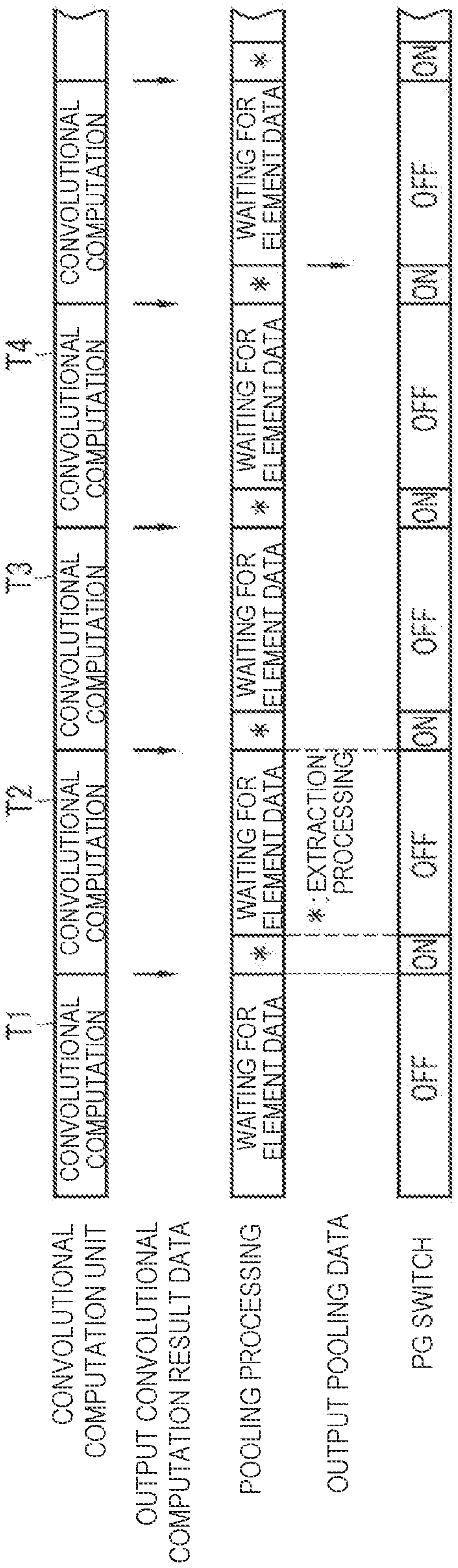
FIG. 9 is an explanatory diagram illustrating a period in which a PG switch is turned off.

On the other hand, as illustrated in FIG. 9, the pooling processing unit 22 is in a state of waiting for the input of the element data, in a period T1 in which the convolutional computation unit 21 performs the convolutional computation. In the period T1 of the state of waiting for the input of the element data, the PG switch 35 is turned off by the power gating control unit 14, and power supply to the register 32 of each of the pooling processing units 22 is blocked.

The PG switch 35 is turned on by the power gating control unit 14 at a timing when the first element data (the convolutional computation result data) is output from the convolutional computation unit 21. Accordingly, power is supplied to the register 32 of each of the pooling processing units 22, and thus, data can be written in. In a case where the element data output from the convolutional computation unit 21 is input to the pooling processing unit 22 through the activation function processing unit 23, the input element data is compared with the data retained in the register 32 by the comparator 33, and the multiplexer 34 is controlled on the basis of the comparison result. The register 32 is reset when the convolutional computation is started, and retains the initial value (the value "0"), and thus, the input element data is selected by the multiplexer 34, and the element data is written in the register 32.

As described above, in a case where the first element data is written in the register 32, the pooling processing unit 22 waits for the input of the second element data calculated by the convolutional computation unit 21 in a period T2. The PG switch 35 is turned off by the power gating control unit 14, the power supply to the register 32 of each of the pooling processing units 22 is blocked.

The PG switch 35 is turned on by the power gating control unit 14 at a timing when the convolutional computation unit 21 outputs the second element data, and thus, power is supplied to the register 32. The second element data output from the convolutional computation unit 21 is compared with the element data retained in the register 32 by the comparator 33, and the multiplexer 34 is controlled on the basis of the comparison result. The register 32 is non-volatile, and thus, the data retained before the power source is blocked is output by the restart of the power supply. Accordingly, the second element data output from the convolutional computation unit 21 is compared with the element data retained in the register 32 by the comparator 33, and the multiplexer 34 is controlled on the basis of the comparison result.

The first element data is retained in the register 32, and then, the first element data is compared with the second element data by the comparator 33. According to such comparison, the element data with a large value among the element data pieces is selected by the multiplexer 34, and the selected element data is written in the register 32. As described above, in a case where the element data is newly written in the register 32, the convolutional computation unit 21 waits for the third element data to be calculated in a period T3, the PG switch 35 is turned off, and the power supply to the register 32 of each of the pooling processing units 22 is blocked.

The PG switch 35 is turned on by the power gating control unit 14 at a timing when the convolutional computation unit 21 outputs the third element data, and power is supplied to the register 32. The third element data is compared with the element data retained in the register 32 by the comparator 33. The element data with a larger value among the element data pieces is selected by the multiplexer 34, and the selected element data is written in the register 32. In a case where the element data is newly written in the register 32, the convolutional computation unit 21 waits for the fourth element data to be calculated in a period T4, the PG switch 35 is turned off, and the power supply to the register 32 of each of the pooling processing units 22 is blocked.

The PG switch 35 is turned on at a timing when the convolutional computation unit 21 outputs the fourth element data, and power is supplied to the register 32. The fourth element data is compared with the element data retained in the register 32, and the element data with a larger value among the element data pieces is selected and written in the register 32.

Accordingly, the element data with the largest value among the first to fourth element data pieces in the pooling region of the n+1-th layer is retained in the register 32, and the element data retained in the register 32 is output from the pooling processing unit 22, as the element data (the pooling data) of the n+2-th layer. In a case where the element data from the pooling processing unit 22, for example, is latched in the memory unit 12, that is, in a case where the output of the element data is completed, the input of the first element data of the next pooling region is awaited, the PG switch 35 is turned off, and the power supply to the register 32 is blocked.

The convolutional computation unit 21 outputs the fourth element data, and then, calculates the element data for the next pooling region in the same procedure as described above, by further moving the convolutional region Ra. The pooling processing unit 22 compares the element data with the data retained in the register 32 each time when the first to fourth element data pieces are output, retains the element data with the largest value in the new pooling region in the register 32, and outputs the element data as the element data of the n+2-th layer. While the pooling processing unit 22 waits for the input of the element data as described above, the PG switch 35 is turned off, and the power supply to the register 32 is blocked.

By repeatedly performing the procedure described above, all the element data is calculated for each of the first to k-th channels of the n+2-th layer. In a case where there are the k+1-th and subsequent channels in the n+2-th layer, all the element data is calculated for each of all channels by repeating the same procedure as described above. In a case where the number of channels for calculating the pooling data is less than the number of computing units 17, a part of the computing units 17 does not perform the computation, and in such a case, the power supply to the register 32 in the computing unit 17 not performing the computation may be blocked.

As described above, the computation processing device 10 performs the pooling processing by the pooling processing unit 22, and performs the power gating such that the power supply to the register 32 is blocked while the pooling processing unit 22 waits for the input of the element data.

Accordingly, a current leakage of the register 32 in the state of waiting for the input of the element data is suppressed, and the power consumption of the computation processing device 10 is reduced.

A calculational ratio of the power consumption (the power consumption during operation) of a case where the register 32 includes a non-volatile flip-flop using a magnetic tunnel junction element (hereinafter, referred to as a non-volatile configuration) to the power consumption (Power consumption during Operation+Power consumption during Waiting) of a case where the register includes a normal flip-flop that is not non-volatile (hereinafter, referred to as a normal configuration), for example, can be 0.22. In the calculation of the ratio, the power consumption during operation of the non-volatile configuration is set to 10 times that of the normal configuration, the normal configuration is set to "Power consumption during Waiting:Power consumption during Operation" of "30:110", and a ratio of the number of operation cycles of the register 32 in the computation processing device 10 to the number of waiting cycles is set to "0.006".

Figure 10:
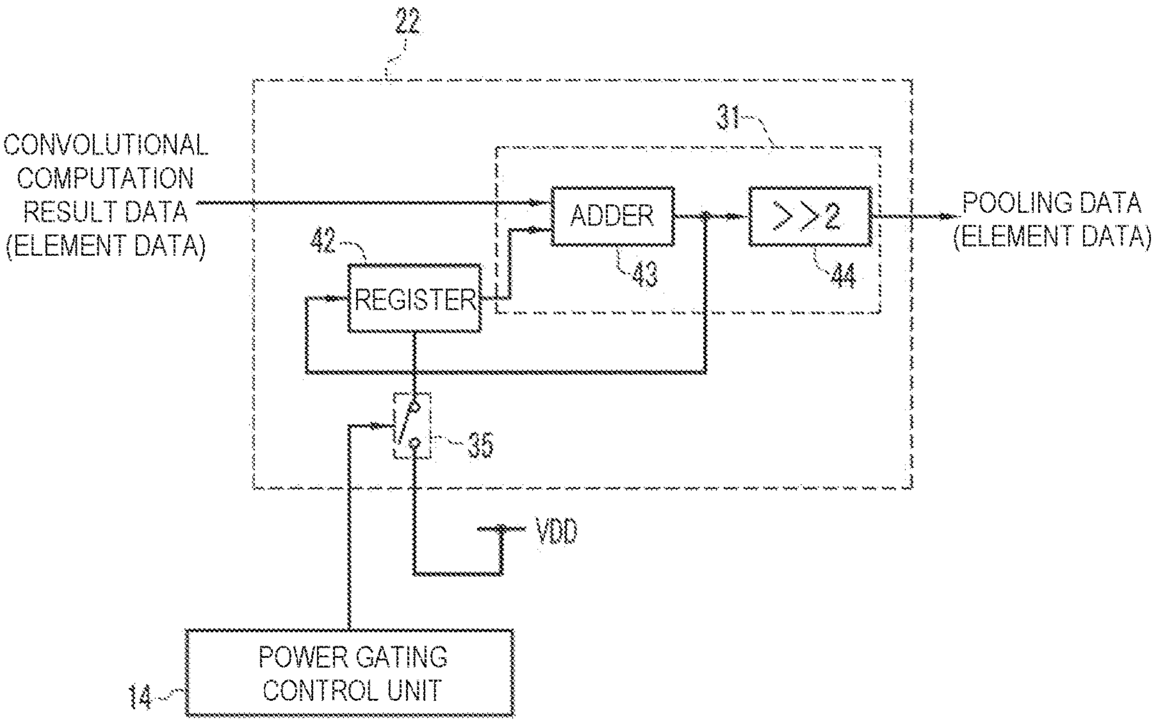
FIG. 10 is a block diagram illustrating a configuration example of the pooling processing unit performing average value pooling processing.

FIG. 10 illustrates an example in which the pooling processing unit 22 is configured to perform the average value pooling processing of outputting the average value of the element data of the pooling region. The pooling processing unit 22 includes the pooling computation circuit 31 and a register 42, and the pooling computation circuit 31 includes an adder 43 and a 2-bit shifter 44, and calculates the average value of the element data of the pooling region, in cooperation with the register 42. The adder 43 adds the data retained in the register 42 and the element data that is the convolutional computation result data to be input. The register 42 is a non-volatile storage circuit for pooling, and retains an addition result of the adder 43. The 2-bit shifter 44 is a bit shift circuit, and is provided as a divider. The 2-bit shifter 44 shifts the addition result of the adder 43 obtained by adding up to the final element data of the pooling region by 2 bits, and thus, calculates a quotient obtained by the division with the number of (four) element data pieces of the pooling region.

According to the configuration described above, the pooling processing unit 22 outputs a shift computation result from the 2-bit shifter 44 as the element data (the pooling data) that is the average value of the element data of the pooling region each time when four element data pieces of the pooling region are input.

The register 42 is non-volatile, as with the register 32 (refer to FIG. 6), and is subjected to the power gating, in accordance with the on and off of the PG switch 35. Therefore, in the pooling processing period, while the pooling processing unit 22 waits for the input of the element data from the convolutional computation unit 21, that is, while the pooling processing unit 22 does not perform the processing, the PG switch 35 is turned off, and the power supply is blocked. Accordingly, the power consumption of the computation processing device 10 is reduced.

Figure 11:
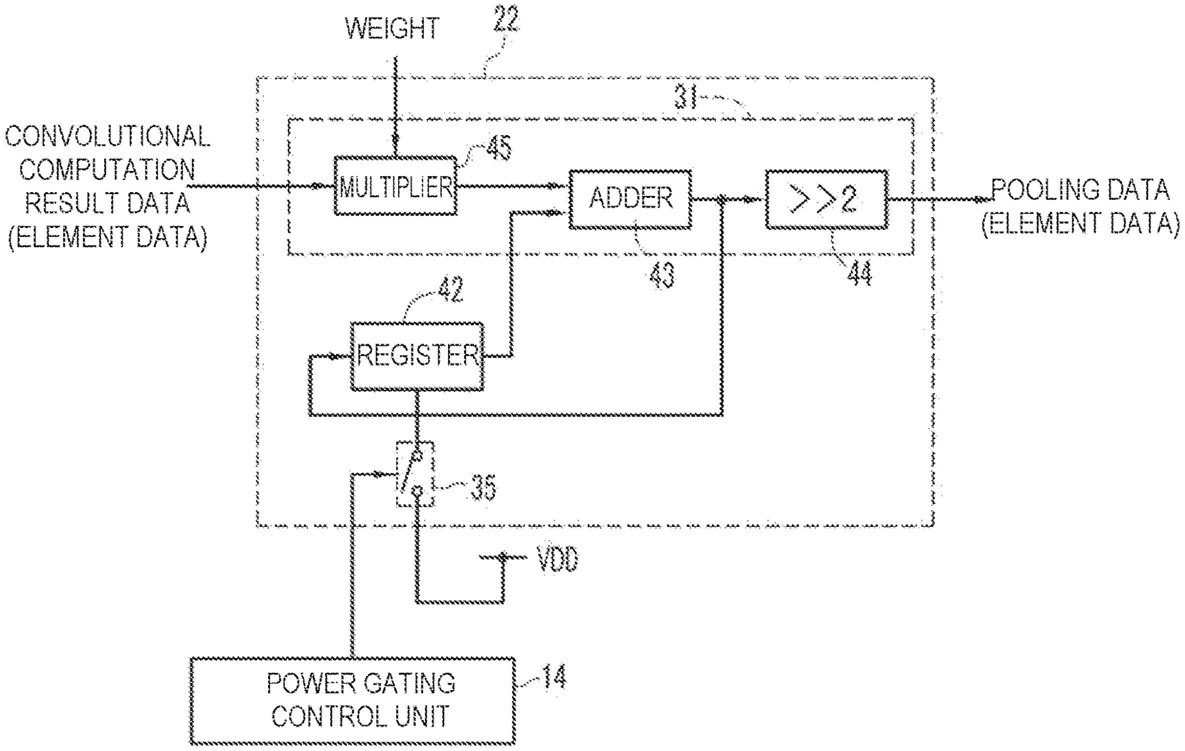
FIG. 11 is a block diagram illustrating a configuration example of the pooling processing unit performing weighting average value pooling processing.

As with an example illustrated in FIG. 11, a multiplier 45 multiplying a predetermined weight is provided on the previous stage of the adder 43, and weighting according to the position of the element data may be performed with respect to the element data to be input as a convolutional computation result. The weight, for example, can be a weight according to two-dimensional Gaussian.

Figure 12:
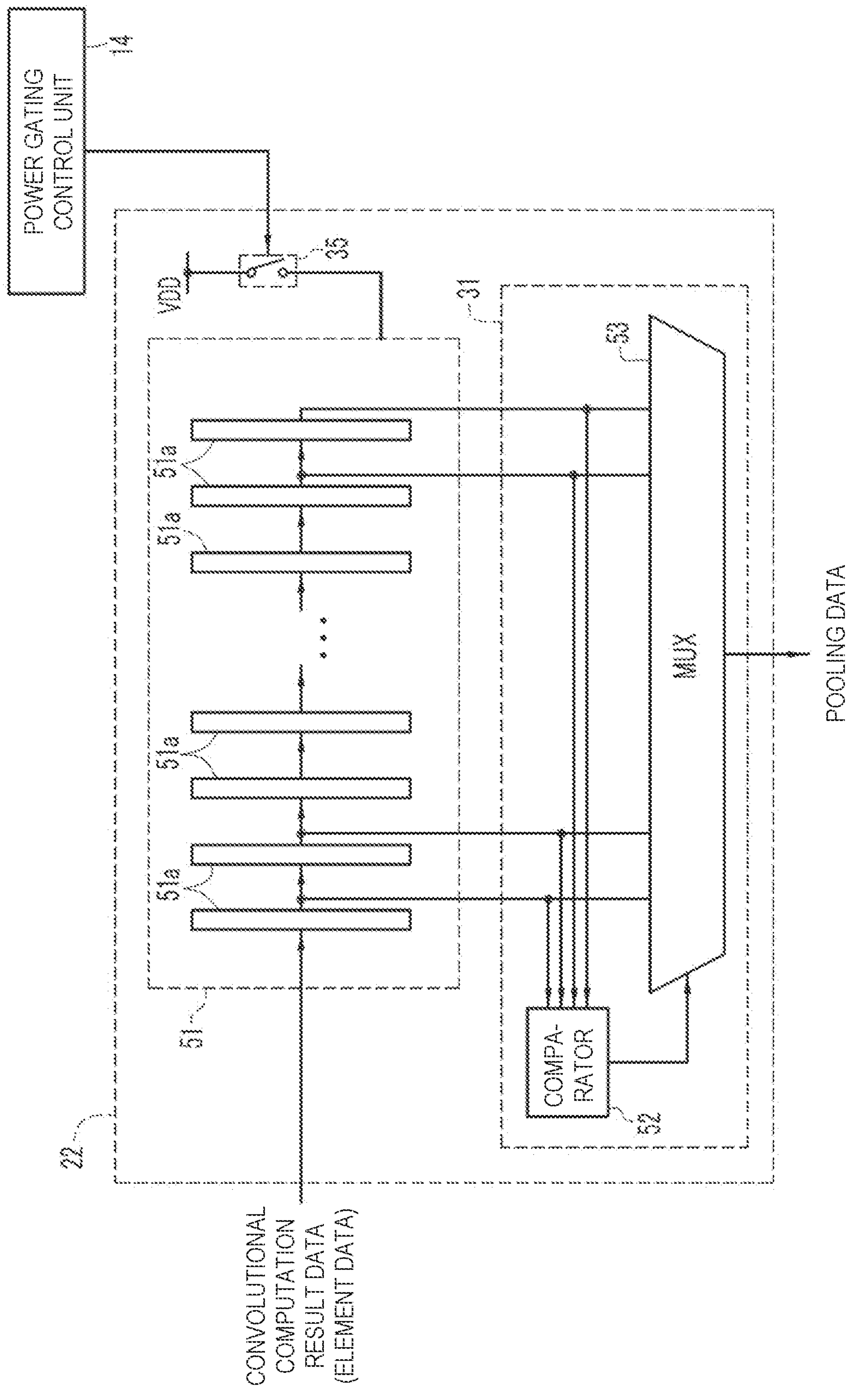
FIG. 12 is a block diagram illustrating the pooling processing unit in which a register unit includes buffers connected in a multiple-stage.

FIG. 12 illustrates an example of the pooling processing unit 22 in which a register unit 51 as a storage circuit for pooling includes buffers 51*a* provided in a multiple-stage. The pooling processing unit 22 in this example includes a comparator 52, and a multiplexer 53 as a selector, in addition to the register unit 51. The element data (the convolutional computation result data) from the convolutional computation unit 21 is input to the register unit 51.

In this example, the pooling region is 2 rows and 2 columns. For the channel of the layer to be a target of the pooling processing, the convolutional computation unit 21 sequentially calculates the element data for each row from the first row, and for each of the rows, the convolutional computation unit sequentially calculates the element data from one end toward the other end of the row. The number of columns of the channel of the layer to be a target of the pooling processing is an even number.

Each bit of the data is input to each of the buffers 51*a* in parallel, and for example, the buffer 51*a* retains the data input in synchronization with a clock, and outputs the retained data in parallel. For example, as such a buffer 51*a*, a parallel-in and parallel-out (PIPO) shift register can be used. When the number of columns (the number of element data of one row) of each of the channels of the layer to be a target of the pooling processing is set to Y (Y is an even number of 2 or more), in the register unit 51, the buffer 51*a* is connected to a (Y+2) stage.

Each of the buffers 51*a* is connected in a multiple-stage such that the output of the previous stage is input to the buffer 51*a* of the subsequent stage. The element data from the convolutional computation unit 21 is input to the buffer 51*a* of the first stage through the activation function processing unit 23, and the buffers 51*a* of the second and subsequent stages are connected such that the output from the buffer 51*a* of the previous stage is input to the buffer 51*a* of the subsequent stage. The clock is input to each of the buffers 51*a*, in synchronization with the input of the element data to the buffer 51*a* of the first stage. Accordingly, the element data from the convolutional computation unit 21 is retained in the buffer 51*a* of the first stage each time when the element data is input to the register unit 51, and the buffers 51*a* of the second and subsequent stages retain the element data output from the buffer 51*a* of the previous stage.

The element data from each of the buffers 51*a* of the first stage, the second stage, the Y+1-th stage, and the Y+2-th stage is input to the comparator 52 and the multiplexer 53 configuring the pooling computation circuit 31, as a data group. The comparator 52 compares four element data pieces to be input with each other, and outputs a selection signal for selecting and outputting the element data with the largest value. The multiplexer 53 selects and outputs one element data piece among four input element data pieces, on the basis of the selection signal.

When four element data pieces output (retained) by each of the buffers 51*a* of the first stage, the second stage, the Y+1-th stage, and the Y+2-th stage are a combination of the element data in one pooling region, the pooling computation circuit 31 performs the comparison of the comparator 52 and the selection of the multiplexer 53, under the control of the controller 15. Specifically, in a case where m is an integer of 1 or more, the $(2m-1)\cdot Y$-th element data is input, and then, the comparison of the comparator 52 and the selection of the multiplexer 53 are performed each time when two element data pieces are input, until the $2m\cdot Y$-th element data is input.

By configuring the pooling processing unit 22 as described above, the element data to be the maximum value of each of a plurality of pooling regions of 2 rows and 2 columns obtained by dividing the channel to be a target of the pooling processing such that the regions do not overlap with each other is selected by the multiplexer 53, and is output as the pooling data.

The register unit 51 is configured as a non-volatile storage circuit. Each of the buffers 51*a* is non-volatile. As with the other example, it is preferable that the buffer 51*a* includes a plurality of non-volatile flip-flops (NV-FF) using a magnetic tunnel junction element. A driving voltage (VDD) is applied to the register unit 51 through the PG switch 35, and in the pooling processing period, the PG switch 35 is turned off while the pooling processing unit 22 waits for the input of the element data from the convolutional computation unit 21, and thus, the power consumption is reduced. When the element data from the convolutional computation unit 21 is input and stored in the buffer 51*a* of the first stage, and simultaneously, the element data from the buffer 51*a* of the previous stage is input and stored in each of the buffers 51*a* of the second and subsequent stages, and when the pooling data is output, the comparison of the element data by the comparator 52 and the selection of the multiplexer 53 are performed, the PG switch 35 is turned on until the output from the multiplexer 53 is completed, and the PG switch 35 is turned off while the pooling processing unit 22 is not required to be operated, and thus, power supply to the register unit 51 is blocked.

REFERENCE SIGN LIST

10: Computation processing device
14: Power gating control unit
21: Convolutional computation unit
22: Pooling processing unit
32, 42: Register
33: Comparator
34: Multiplexer
51: Register unit
51*a*: Buffer
52: Comparator
53: Multiplexer

The invention claimed is:

1. A computation processing device, comprising:
one or more processors;
a convolutional computation unit executed by the one or more processors to sequentially output convolutional computation result data;
a pooling processing unit including a pooling computation circuit and a non-volatile storage circuit for pooling, in which the non-volatile storage circuit for pooling retains the convolutional computation result data or a computation result of the pooling computation circuit, as retained data, and the pooling computation circuit calculates and outputs pooling data subjected to pooling processing to a pooling region by using the retained data each time when the convolutional computation result data is input from the convolutional computation unit; and
a power gating unit that blocks power supply to the non-volatile storage circuit for pooling while waiting for the input of the convolutional computation result data from the convolutional computation unit;
wherein the pooling computation circuit includes a comparator that compares the convolutional computation result data from the convolutional computation unit with the retained data, and a selector, to which the convolutional computation result data from the convolutional computation unit and the retained data are input, that selects and outputs data with a larger value among the input data, on the basis of a comparison result of the comparator,
the non-volatile storage circuit for pooling retains data output from the pooling computation circuit, as new retained data, and
the pooling processing unit executed by the one or more processors to output the retained data retained in the non-volatile storage circuit for pooling by the input of each of the convolutional computation result data pieces in the pooling region to the pooling computation circuit, as the pooling data.

2. The computation processing device according to claim 1,
wherein the convolutional computation result data in the pooling region of p rows and q columns on a channel in which a plurality of the convolutional computation result data pieces are two-dimensionally arrayed is input to the pooling processing unit.

3. The computation processing device according to claim 2,
wherein the pooling region is 2 rows and 2 columns.

4. The computation processing device according to claim 1,
wherein the non-volatile storage circuit for pooling includes a non-volatile register.

5. The computation processing device according to claim 4,
wherein the non-volatile register includes a non-volatile flip-flop.

6. A computation processing device, comprising:
one or more processors;
a convolutional computation unit executed by the one or more processors to sequentially output convolutional computation result data;
a pooling processing unit including a pooling computation circuit and a non-volatile storage circuit for pooling, in which the non-volatile storage circuit for pooling retains the convolutional computation result data or a computation result of the pooling computation circuit, as retained data, and the pooling computation circuit calculates and outputs pooling data subjected to pooling processing to a pooling region by using the retained data each time when the convolutional computation result data is input from the convolutional computation unit; and
a power gating unit that blocks power supply to the non-volatile storage circuit for pooling while waiting for the input of the convolutional computation result data from the convolutional computation unit;
wherein the pooling computation circuit includes an adder that adds the convolutional computation result data from the convolutional computation unit and the retained data, and a divider that divides an addition result of the adder by the number of convolutional computation result data in the pooling region,
the non-volatile storage circuit for pooling retains the addition result of the adder, as new retained data, and
the pooling processing unit executed by the one or more processors to output data obtained by dividing the addition result of the adder obtained by the input of each of the convolutional computation result data pieces in the pooling region to the pooling computation circuit with the divider, as the pooling data.

7. The computation processing device according to claim 6, wherein the divider is a bit shift circuit that shifts data with a bit number according to the number of respective convolutional computation result data pieces in the pooling region.

8. A computation processing device, comprising:

one or more processors;

a convolutional computation unit executed by the one or more processors to sequentially output convolutional computation result data;

a pooling processing unit including a pooling computation circuit and a non-volatile storage circuit for pooling, in which the non-volatile storage circuit for pooling retains the convolutional computation result data or a computation result of the pooling computation circuit, as retained data, and the pooling computation circuit calculates and outputs pooling data subjected to pooling processing to a pooling region by using the retained data each time when the convolutional computation result data is input from the convolutional computation unit; and a power gating unit that blocks power supply to the non-volatile storage circuit for pooling while waiting for the input of the convolutional computation result data from the convolutional computation unit;

wherein the pooling computation circuit includes a multiplier that multiplies and weights the convolutional computation result data from the convolutional computation unit by a predetermined weight, an adder that adds a multiplication result from the multiplier and the retained data, and a divider that divides an addition result of the adder by the number of convolutional computation result data in the pooling region, the non-volatile storage circuit for pooling retains the addition result of the adder, as new retained data, and the pooling processing unit executed by the one or more processors to output data obtained by dividing the addition result of the adder obtained by the input of each of the convolutional computation result data pieces in the pooling region to the pooling computation circuit with the divider, as the pooling data.

9. A computation processing device, comprising:

one or more processors;

a convolutional computation unit executed by the one or more processors to sequentially output convolutional computation result data;

a pooling processing unit including a pooling computation circuit and a non-volatile storage circuit for pooling, in which the non-volatile storage circuit for pooling retains the convolutional computation result data or a computation result of the pooling computation circuit, as retained data, and the pooling computation circuit calculates and outputs pooling data subjected to pooling processing to a pooling region by using the retained data each time when the convolutional computation result data is input from the convolutional computation unit; and a power gating unit that blocks power supply to the non-volatile storage circuit for pooling while waiting for the input of the convolutional computation result data from the convolutional computation unit, wherein the convolutional computation unit executed by the one or more processors to sequentially output the convolutional computation result data in a row direction of a channel in which a plurality of the convolutional computation result data pieces are two-dimensionally arrayed for each row of the channel, the pooling processing unit executed by the one or more processors to output the convolutional computation result data to be a maximum value in each pooling region obtained by dividing the plurality of convolutional computation result data pieces for each 2 rows and 2 columns of the channel, as the pooling data, the non-volatile storage circuit for pooling includes non-volatile buffers connected to Y+2 stages in which the number of columns of the channel is Y, where Y is an even number of 2 or more, and each time when the convolutional computation result data from the convolutional computation unit is input to a buffer of a first stage, the buffer of the first stage retains and outputs the input convolutional computation result data, and each of buffers of second and subsequent stages retains and outputs the convolutional computation result data output from a buffer of a previous stage, the pooling computation circuit includes a comparator, to which a data group including each of the convolutional computation result data pieces from each buffer of a first stage, a second stage, a Y+1-th stage, and a Y+2-th stage is input, that compares each of the convolutional computation result data pieces of the data group, and a selector that selects and outputs the convolutional computation result data to be a maximum value among the data group, on the basis of a comparison result of the comparator, and the pooling processing unit executed by the one or more processors to output the convolutional computation result data output from the selector when each of the convolutional computation result data pieces of the data group is a combination of the convolutional computation result data in one of the pooling regions, as the pooling data.

10. The computation processing device according to claim 9, wherein the buffer is a non-volatile parallel-in parallel-out type shift register.

11. The computation processing device according to claim 10, wherein the shift register includes a non-volatile flip-flop.

12. The computation processing device according to claim 11, wherein the non-volatile flip-flop is a circuit including a magnetic tunnel junction element.

13. A computation processing device, comprising:

one or more processors;

a convolutional computation unit executed by the one or more processors to sequentially output convolutional computation result data in a row direction of a channel in which a plurality of the convolutional computation result data pieces are two-dimensionally arrayed for each row of the channel; and a pooling processing unit including a pooling computation circuit and a non-volatile storage circuit for pooling, the pooling processing unit executed by the one or more processors to output the convolutional computation result data to be a maximum value in each pooling region obtained by dividing the plurality of convolutional computation result data pieces for each 2 rows and 2 columns of the channel, as pooling data, wherein the non-volatile storage circuit for pooling includes buffers connected to Y+2 stages in which the number of columns of the channel is Y, where Y is an even number of 2 or more, and each time when the convolutional computation result data from the convolutional computation unit is input to a buffer of a first stage, the buffer of the first stage retains and outputs the input convolutional computation result data, and each of buffers of second and subsequent stages retains and outputs the convolutional computation result data output from a buffer of a previous stage, the pooling computation circuit includes a comparator, to which a data group including each of the convolutional computation result data pieces from each buffer of a first stage, a second stage, a Y+1-th stage, and a Y+2-th stage is input, that compares each of the convolutional computation result data pieces of the data group, and a selector that selects and outputs the convolutional computation result data to be a maximum value among the data group, on the basis of a comparison result of the comparator, and the pooling processing unit executed by the one or more processors to output the convolutional computation result data output from the selector when each of the convolutional computation result data pieces of the data group is a combination of the convolutional computation result data in one of the pooling regions, as the pooling data.

* * * * *